United States Patent [19]

Ul Haq et al.

[11] Patent Number: 5,018,106

[45] Date of Patent: May 21, 1991

[54] STATIC RANDOM ACCESS MEMORY WITH MODULATED LOADS

[75] Inventors: Mohammed E. Ul Haq, Sunnyvale; Kenneth R. Smits, San Ramon, both of Calif.

[73] Assignee: VLSI Technology, Inc., San Jose, Calif.

[21] Appl. No.: 344,186

[22] Filed: Apr. 27, 1989

[51] Int. Cl.$^5$ .............................................. G11C 7/00
[52] U.S. Cl. ................................. 365/203; 365/233.5; 365/190
[58] Field of Search ...................... 365/233.5, 203, 190

[56] References Cited

U.S. PATENT DOCUMENTS

| | | | |
|---|---|---|---|
| 4,272,832 | 6/1981 | Ito | 365/233.5 |
| 4,514,831 | 4/1985 | Oritani | 365/233.5 |
| 4,592,026 | 5/1986 | Matsukawa et al. | 365/233.5 |
| 4,612,631 | 9/1986 | Ochii | 365/233.5 |
| 4,616,344 | 10/1986 | Noguchi et al. | 365/233.5 |
| 4,638,462 | 1/1987 | Rajeevakumar et al. | 365/233.5 |
| 4,658,381 | 4/1986 | Reed et al. | 365/233.5 |
| 4,661,931 | 4/1987 | Flannagan et al. | 365/233.5 |
| 4,706,218 | 11/1987 | Sodd | 365/233.5 |

OTHER PUBLICATIONS

Miyaji et al., "A 25ns 4Mb CMOS SRAM with Dynamic Bit Line Loads", ISSCC Digest of Tech. Papers, pp. 250-251, Feb. 1989.
Ohtani et al., "A 25ns 1Mb CMOS SRAM", ISSCC Digest of Technical Papers, pp. 264-265, Feb. 1987.

*Primary Examiner*—Stuart N. Hecker
*Assistant Examiner*—Michael A. Whitfield
*Attorney, Agent, or Firm*—Clifton L. Anderson

[57] ABSTRACT

A static random access memory (SRAM) comprises plural memory cells, a true-bit load and a complementary-bit load, a true-bit line and a complementary bit line, a sense amplifier and an address transition detector. The address transition detector is used to generate load pulses which switch off the loads just after either of the memory cells is selected. This speeds signal development during a read (or write) operation. Since provision is made for modulating the loads, they can be designed to permit larger-than-conventional currents to flow therethrough when maximally on. The loads are maximally on just after cell deselection to facilitate bit-line equalization between cell selections. Thus, the present invention provides for briefer inter-select periods, quicker reads upon cell selection, and, thus, a faster SRAM overall.

1 Claim, 4 Drawing Sheets

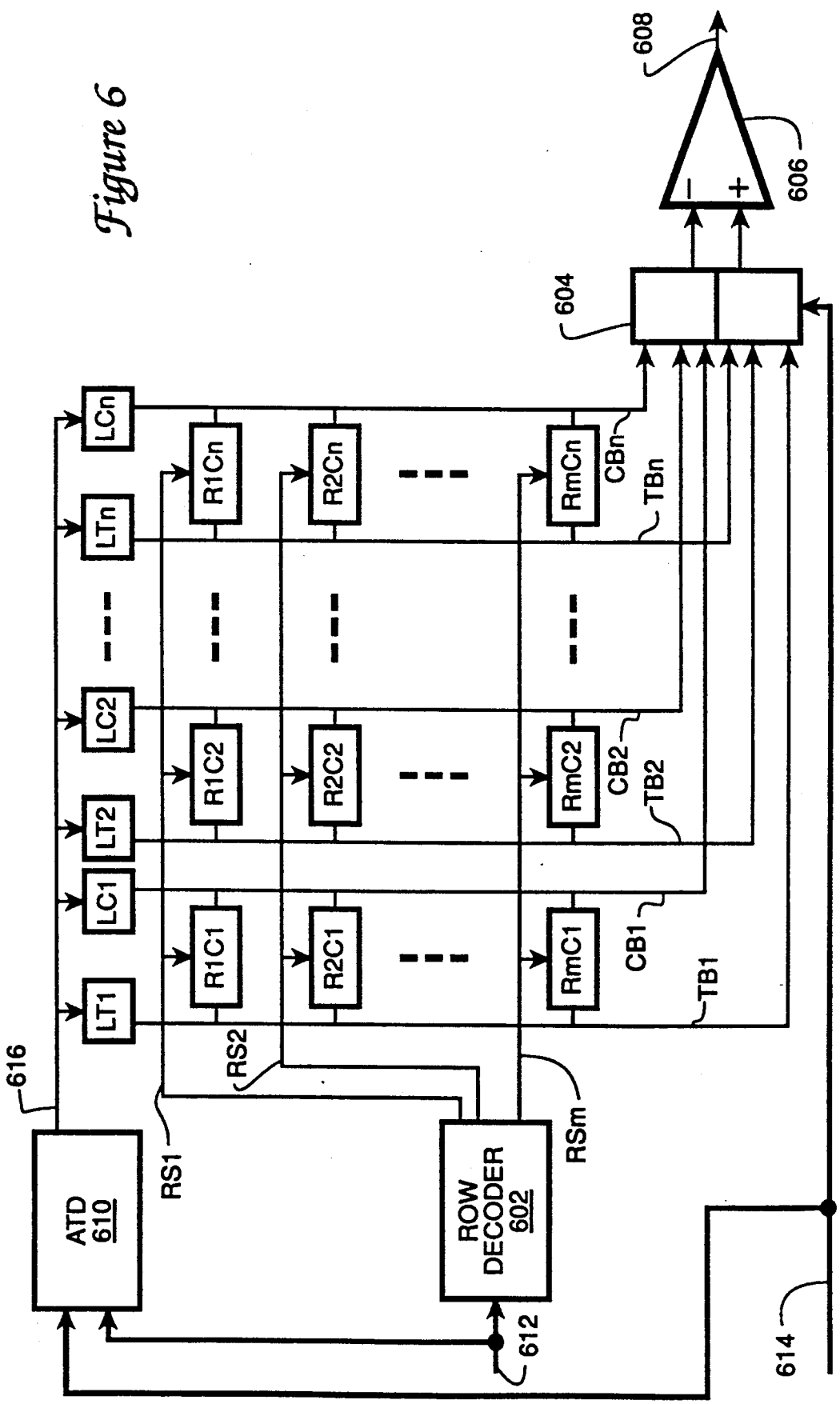

STATIC RANDOM ACCESS MEMORY WITH MODULATED LOADS

BACKGROUND OF THE INVENTION

The present invention relates to semiconductor devices and, more particularly, to static random access memories. It is a major objective of the present invention to enhance the speed of such memories.

Modern integrated circuit technology is dedicated in large part to making smaller and faster devices. Because of the large numbers required for most applications, integrated circuit memories play a significant role in determining the operational speed available in a system. A system's speed can be limited by the time required for accessing information from memory. Dynamic random access memories (DRAMs) are widely used because of their high levels of integration and relatively low cost; DRAMS, however, require refresh cycles which limit memory access speeds. Static random access memories (SRAMs) require no refreshing, and thus provide for faster memories, albeit at greater cost and lower levels of integration. Accordingly, SRAMS are a memory of choice in application requiring fast access times, for example, memory caches. However, these applications frequently call for even faster access times than are provided by available SRAMs.

A typical SRAM includes multiple memory cells. Each memory cell is a four or six-transistor device capable of storing a logic high or a logic low. When a given cell is selected it can be read from or written to, depending on the voltages applied to its outputs. Typically, an SRAM memory cell has complementary outputs. A sense amplifier is typically used to detect the sense of the differential between the complementary outputs to read the contents of a memory cell. A single sense amplifier can be connected to several memory cells. Select lines are used to enable at most one cell for each sense amplifier at any given time. In a typical memory configuration, a row select line carries the select signal that differentiates cells tied to a given sense amplifier.

There are two transition constraints which limit the speed with which SRAMs can be read. In the first place, there is a delay required for a bit-line signal to develop after a memory cell is addressed. In the second place, additional time is required for the bit lines to stabilize once a memory cell is deselected. In fact, some SRAMs include switches between complementary bit lines which can be closed after deselection to facilitate bit-line recovery and decrease the wait require for addressing another cell sharing the same bit lines. The disadvantage of this approach is that there is a delay between successive operations associated with the time required to turn the switch on to wait for stabilization, and then to turn the switch off.

What is needed is a faster method of stabilizing bit lines after cell deselection. Preferably, the method would also improve signal development time after cell selection to provide an overall improvement in cell access speeds.

SUMMARY OF THE INVENTION

In accordance with the present invention, bit line loads for an array of SRAM cells are pulsed to decrease load currents therethrough when a cell is selected. As a result, a selected cell quickly dominates the associated bit lines, rapidly developing a differential voltage sufficient for reading. Since the load currents are modulated rather than constant, larger than normal maximum load currents can be used. The maximum load currents provide for faster equalization of bit-lines upon deselection.

Synchronization of the load pulse and cell selection can be performed using an address transition detector or other logic for deriving the pulse from changes in the address lines. The load pulse for reading a memory cell occurs after deselection of any previously addressed cells sharing bit lines. In fact, bit-line stabilization should be substantially attained before the onset of the load pulse. Preferably, the load pulse is applied immediately after the onset of the selection of the cell to be read. If a clocked sense amplifier is used, the address transition detector can be used to derive a sense amplifier clock pulse which samples the sense amplifier signal during activation of the load pulse.

Each load can be a single transistor or a pair of parallel transistors. In each case, the gate of one transistor is controlled by a load control signal generated from the address transition detector. A second transistor can be used to provide a relatively small current which is not switched to limit the negative-going swing of the bit lines when the first transistor is switched to a high-impedance state. PMOS transistors can be used for the load transistors since these are normally on and readily available voltages can be used for switching. NMOS transistors can be used for convenience and better compatibility with the predominant technology applied to a CMOS integrated circuit.

The present invention switches off existing load transistors during cell selections, instead of switching on a shunting transistor between cell selections. Thus, minimal delay is required between cell selections. As in the case of the shunting transistor, between-selection stabilization is attained. However, the present invention further provides for faster signal development upon cell selection. Thus, the present invention provides for faster signal development upon selection and reduced stabilization time between selections. These and other features and advantages of the present invention are apparent from the description below with reference to the following drawings.

BRIEF DESCRIPTION OF THE DRAWINGS

FIG. 6 is an alternative memory system in accordance with the present invention.

DESCRIPTION OF THE PREFERRED EMBODIMENTS

Figure 1:
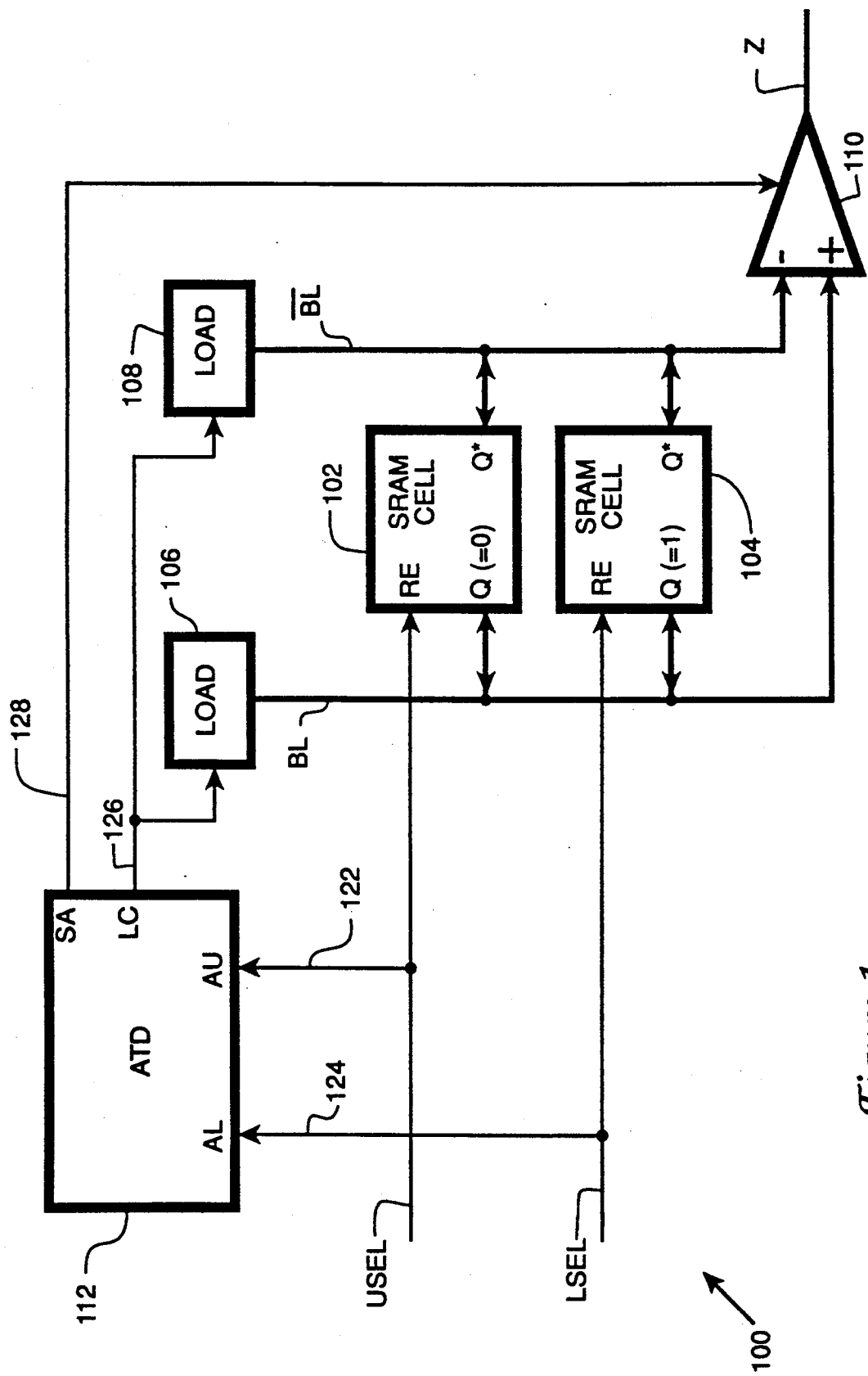
FIG. 1 is a block diagram of a memory system in accordance with the present invention.

In accordance with the present invention, a memory 100 comprises an upper storage cell 102, a lower storage cell 104, a true-bit load 106, a complementary-bit load 108, a sense amplifier 110, and an address transition detector (ATD) 112, as shown in FIG. 1. A true-bit line 114 couples true-bit load 106 with Q ports of cells 102 and 104 and with the "+" input of sense amplifier 108. A complementary-bit line BL couples complementary-bit load 108 with the Q* ports of cells 102 and 104 and with the "−" input of sense amplifier 108. Loads 106 and 108 are pulsed to a high-impedance state in synchronizism with the selection of either cell 102 or cell 104 to increase signal development speed. This permits loads 106 and 108 to be larger than normal so that residual potential differences between true-bit line 114 and complementary-bit line BL can be dissipated without switching between cell selections.

The purpose of memory 100 is to permit the storage and retrieval of information. Information is stored in binary form, one bit in each of cells 102 and 104. Memory 100 thus is limited to two bits of storage, but the present invention is applicable to any size memory. By way of example, upper cell 102 is shown storing a "0" or logic low, while lower cell 104 is shown storing a "1" or logic high. These values are used in explaining the operation of memory 100 below.

When upper select line USEL is activated, a voltage of zero volts representing the stored "0", is supplied at the Q port of cell 102; concurrently, a voltage of five volts, representing a logic high as the complement of the value stored, is supplied at the Q* port of cell 102. In this event, sense amplifier 110 will detect a negative differential between true-bit line 114 and complementary-bit line BL, resulting in a logic low output from memory output Z.

Likewise, when lower select line LSEL to the enable input of cell 104 is activated, a voltage of five volts, representing the stored "1", is supplied at the Q port of cell 104; concurrently, a voltage of zero volts, representing a logic low as the complement of the value stored, is supplied at the Q* port of cell 104. In this event, sense amplifier 110 will detect a positive differential between true-bit line 114 and complementary-bit line BL, resulting in a logic high output.

Thus, select lines USEL and LSEL permit reading of information stored in cells 102 and 104. Writing is performed similarly, except that the bit lines are forced high or low, as determined by the bit to be stored, so that the forced level is written into a selected cell.

Address transition detector 112 detects changes in the levels of select lines USEL and LSEL. To this end, upper select line 118 is coupled to an AU input of address transition detector 112 via a line 122, and lower select line LSEL is coupled to an AL input of address transition detector 112. When either select line is activated, address transition detector 112 transmits a pulse from its load control output LC via line 126 to control inputs of loads 106 and 108. This pulse causes both loads 106 and 108 to switch temporarily into a high impedance state.

The present invention provides for both clocked and unclocked sense amplifiers. An unclocked sense amplifier provides an output which continually represents the relative voltages on bit lines 114 and BL. A clocked sense amplifier performs a one-shot sample of this relative voltage just after a cell has been selected. Sense amplifier 110 is a hybrid device which sums the outputs of a clocked and an unclocked sense amplifier. The clock pulse for the clocked portion of sense amplifier 110 is provided via line 128 from the SA output of address transition detector 112. Like the load pulse, the SA clock pulse is derived from and synchronized relative to activations of select lines USEL and 120.

Figure 2:
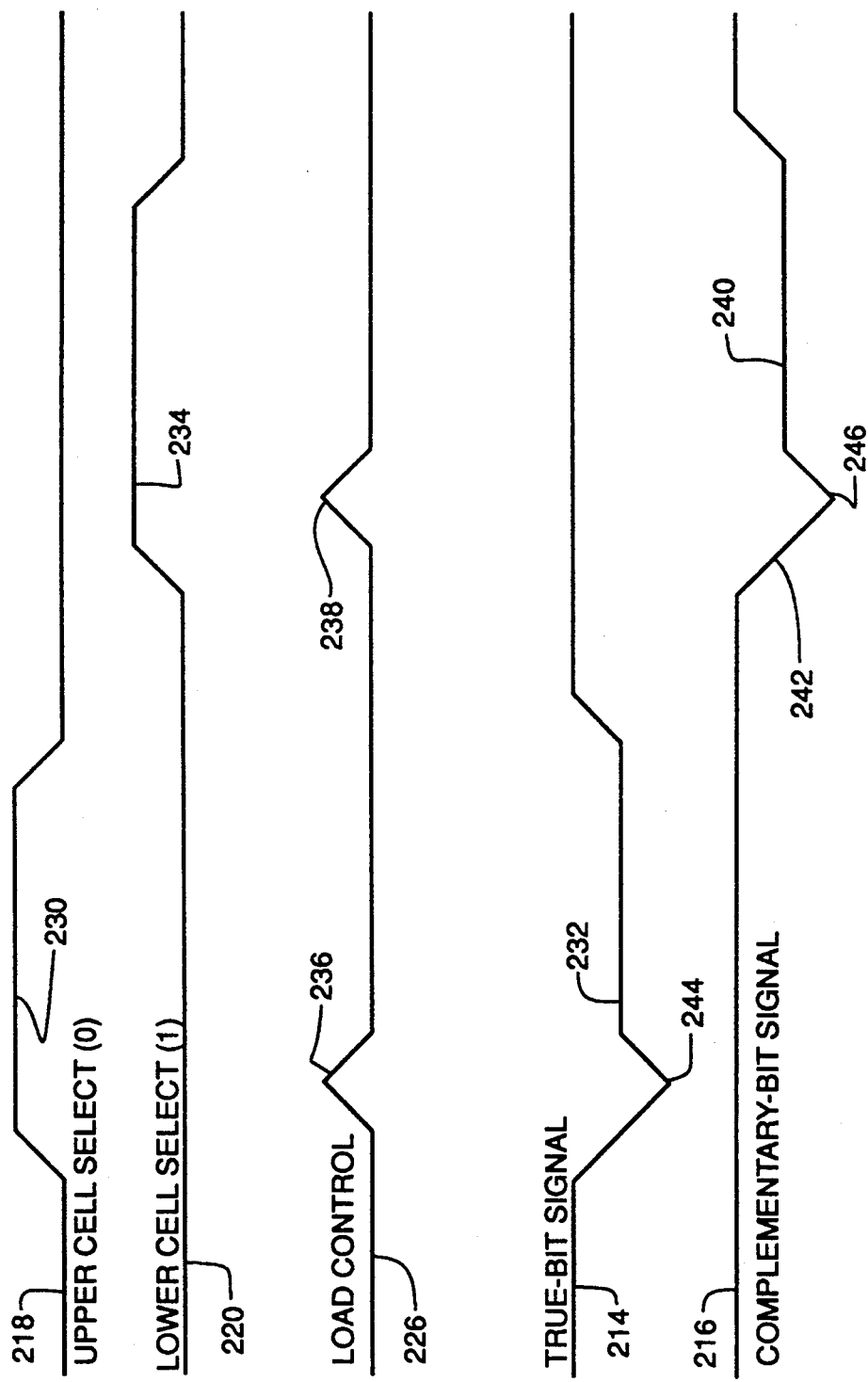
FIG. 2 is a timing diagram for the memory system of FIG. 1.

The timing relations between the select signals and the load pulse and sense amplifier clock derived therefrom are illustrated in the timing chart of FIG. 2. An upper select signal 218 is conveyed along upper select line USEL and line 122, while a lower select signal 220 is conveyed along lower select line LSEL and line 124. A load control signal 226 is conveyed along line 126 to the control inputs of loads 106 and 108. A true-bit signal 214 is conveyed along true-bit line 114, while a low bit signal 216 is conveyed along complementary-bit line BL.

Collectively, the illustrated upper and lower select signals 218 and 220 represent a situation posing a significant challenge to the speed of a static RAM memory: the successive readings of two memory cells storing opposite values and sharing bit lines. Activation of upper select line USEL, as indicated by segment 230 of upper select signal 218, results in a negative voltage swing 232 in true-bit signal 214. Likewise, subsequent activation of lower select line LSEL, as indicated by segment 234 of lower select signal 220, results in a negative voltage swing 240 in complementary-bit signal 216. If true-bit signal 214 does not return to its equilibrium level by the onset of lower select activation segment 234, an ambiguous or erroneous memory output could result.

In earlier devices in accordance with the prior art, currents through the loads were relied on to equalize bit lines between cell selections. These currents had to be limited by the loads so that the outputs of the memory cells would not be overwhelmed during read operations. Optimizing currents and loads for reading of the memory cells imposed an upper limit on the rate at which cells sharing bit lines could be read in succession.

The prior art addressed this limit by shorting the high and low bit lines between selections. As indicated above, this is done using a shunting transistor which is switched on after deselection of one cell and turned off before selection of the next cell. While this results in improved sequential access time, there is still a significant access time constraint since the shunting transistor has to be switched on and switched off between accesses.

The present invention represents a synergistic combination of the two prior art approaches--the load current is relied on for equalization of the bit lines between cell selections as in the earlier devices, and switching is relied upon to allow for faster equalization as in the devices using a shunting transistor. In the present case, it is the loads that are switched. Instead of being turned on just after deselection, the loads are turned off just after selection. Accordingly, load control signal 226 includes a negative-going pulse 236 occurring just after the onset of upper select activation segment 230 and a negative-going pulse 238 occurring just after the onset of lower select activation segment 234. Ideally, the onset of a load control pulse would occur at the same times as the corresponding address selection transition; in practice, the load control pulse should be initiated immediately after the address selection transition. Those skilled in the art will be able to construct the logic for address transition detector 112 to derive load pulses 236 and 238 with the illustrated or other required timing relations.

The purpose of load pulses 236 and 238 is to facilitate signal development during a read operation. For example, load pulse 238 diminishes the impact of the current through true-bit load 104 on the voltage at the "+" terminal of sense amplifier 110, and thus enhances the relative contribution of the upper cell Q output on that terminal. This causes the negative going onset transition 244 of complementary-bit swing 240 to be steeper and deeper than it would be without load pulse 238. This enhanced onset transition 242 makes complementary-bit swing 240 easier to detect and more susceptible to earlier detection. This improves the access time of memory 100 by decreasing the time a cell must remain selected to have its value read.

Since the bit-line current is modulated, there is no need to limit the maximum bit-line current to that required for read signal development. Accordingly, loads 106 and 108 include current paths which are 60 $\mu$m wide, as opposed to more conventional current paths which can be about 15 $\mu$m wide. Thus, the maximum current provided through loads 106 and 108 is about four times that available in conventional static RAMs. This greater maximum current is available after cell deselection to provide relatively rapid equalization of bit lines 114 and BL. Furthermore, there is not switching to be completed between deselection of cell 102 and selection of cell 104, which results in complementary-bit swing 240. The net effect is an enhancement in the rate cells sharing bit lines can be accessed in succession.

Address transition detector 112 also derives the clock signal for the clocked portion of sense amplifier 110. The clock pulse is timed to sample the negative peak 244, 246 of each bit-line swing to minimize the affects of any noise on the sense determinations by sense amplifier 110. Thus, a first clock signal overlaps a true-bit peak 242 and a second clock signal overlaps a complementary-bit peak 244, indicated in FIG. 2. The exact onset and duration of the clock pulse can be optimized for a given memory system by a skilled practitioner with appropriate experimentation.

Figure 3:
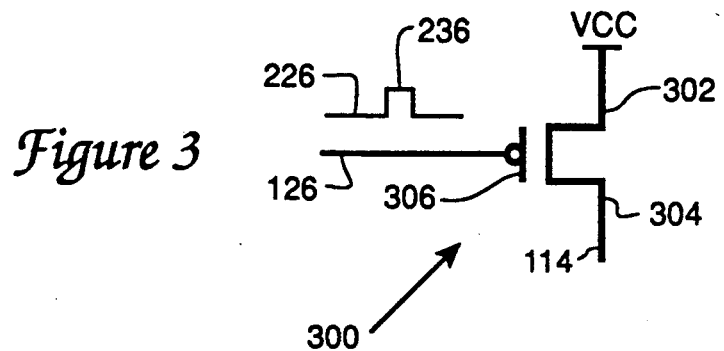
FIG. 3 shows a transistor in a load for the memory system of FIG. 1.

Memory 100 is implemented in complementary metal-oxide-silicon (CMOS) technology, using four transistors per cell 102 and 104. Alternatively, six transistor cells can be used. Each load 106, 108 can be fabricating using a single positive-charge-carrying metal-oxide-silicon (PMOS) transistor. For example true-bit load 106 can employ transistor 300, as shown in FIG. 3. Transistor 300 has its source 302 tied to voltage VCC (5 volts) and its drain 304 coupled to a bit line, e.g., true-bit line 114. The gate 306 of transistor 300 is coupled to load control line 126. The signal 226 on load control line 126 is normally low (0 volts) so that transistor 300 is closed and the current therethrough is at a maximum. Positive going pulse 236 at least turns transistor 300 partially off to limit current flow therethrough. This provides the load modulation. Turning partially off is preferable to turning completely off transistor 300 which might cause excessive swings on the bit lines and thus delay recovery.

Figure 4:
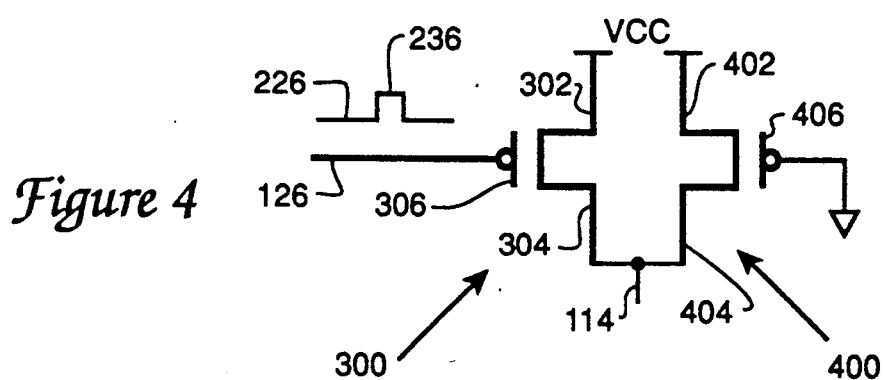
FIG. 4 shows a preferred load for the memory system of FIG. 1 incorporating the transistor of FIG. 3.

To limit the negative bit-line swing, a second PMOS transistor 400 can be placed in parallel with transistor 300, as shown in FIG. 4. The source 402 of transistor 400 is coupled with the source 302 of transistor 300, and thus tied to VCC. The drain 404 of transistor 400 is coupled to the drain 304 of transistor 300 and thus to true-bit line BL. The gate 406 of transistor 400 is tied to ground, so that transistor 400 is normally on. Thus transistor 400 provides a baseline current for true-bit line BL and thus limits the negative voltage swing on true-bit signal 214. Transistor 400 is designed for a lower maximum current than transistor 300. Complementary-bit load 108 can be fabricated similarly to the same end.

Figure 5:
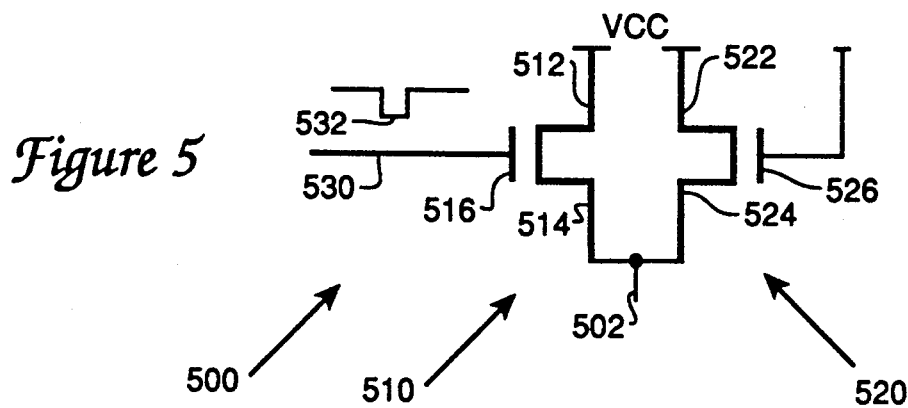
FIG. 5 is alternative load for the memory system of FIG. 1.

In most CMOS processes used today, PMOS transistors require more area when arranged next to NMOS transistors. Accordingly, an alternative load 500 is fabricated using a modulated NMOS transistor 510 and a fixed NMOS transistor 520 as shown in FIG. 5. The drains 512 and 522 of transistors 510 and 520 are tied to VCC, and the sources 514 and 524 are coupled to each other and to a bit line 502. The gate of the fixed transistor 520 is tied to VCC, so that it is normally on. The gate of the modulated transistor 510 is tied to a load control line 530. Load control line 530 is normally high so that modulated transistor 510 is normally on. A negative-going pulse 532 on load control line 530 turns modulated transistor 510 at least partially off. The relatively small current through transistor 520 serves to limit the negative-going swing of bit line 502.

Load 500 must be driven at a level above VCC to compensate for the 0.7 volt gate-to-source electrical potential drop $V_{GS}$ across transistor 510. For this reason, the PMOS implementation of loads 102 and 104 is preferred, despite processing inconvenience. However, numerous factors can affect the process selection for the loads. Where PMOS is used, the bit lines are normally high with a voltage of VCC. A logic high output from a memory cell will cause a drop to $VCC-\Delta V$, where $\Delta V$ is determined by the relative effects of the respective load and the cell output and is typically about 0.5 volts.

The present invention is embodied in a more typical SRAM configuration in memory 600, shown in FIG. 6. Memory 600 comprises an array of memory cells RiCj, where i is a row index ranging from 1 to an integer m and j is a column index ranging from 1 to an integer n. In addition, memory 600 includes a row decoder 602, a column decoder 604, a sense amplifier 606 which provides a memory output 608, an address transition detector 610, and loads LTj and LCj. The memory cells of a given column share a common true-bit line TBj and a common complementary-bit line CBj. For example, true-bit line TB1 couples true-bit load LT1, a respective input of column decoder 604, and cells R1C1, R2C1 and RmC1; while the same cells are coupled by complementary-bit line CB1 to complementary-bit load CL1 and a respective input of column decoder 604.

Address selection is effected by row select and column select signals sent along row select bus 612 and column select bus 614, respectively. Row select bus 612 is coupled to row decoder 602 which activates the appropriate row of cells RiCj for all j via a respective row select line RSi. For example, row select line RS2 can be activated to address memory cells R2C1, R2C2 and R2Cn. Row select bus 612 is also coupled to address transition detection 610 so that a load pulse can be transmitted along a load control line 616 to switch loads to a higher impedance state during reading or writing.

The column select signal along column bus 614 controls column decoder 604 which has two outputs, one, via line CB0 to a "−" terminal of sense amplifier 606, and the other to a "+" input of sense amplifier 606 via line TB0. Column decoder 604 functions as a pair of n:1 multiplexers which operate in tandem so that when a true-bit line TBj is coupled via column decoder 604 to the "+" terminal, the corresponding complementary-bit line CBj is coupled to the "−" terminal. This condition ensures that the output signal along output 608 reflects the differential between the true and complementary outputs of a selected memory cell. For example, when row select line RS2 is activated and the second column, containing R1C2, R2C2 and RmC2, is selected, memory cell R2C2 can be read. The operation of and timings for memory 600 are essentially those described above for memory 100.

Those skilled in the art will recognize that there are many alternative methods of modulating bit-line loads, and many different methods of deriving load control and sense-amplifier clock signals from address signals. Timing derivations may depend on the addressing scheme utilized. Normally, SRAMs use column and row addressing so that column and row address changes can be utilized in various ways to derive the desired timing relations. The relations between the load control signal and the sense amplifier clock can vary, and either can be derived from the other, depending on timing constraints.

Timing constraints will vary according to circuit design and the number of cells on a bit line. Preferably, a load control pulse occurs after the respective select line is activated. However, the load control pulse can occur earlier provided the bit lines have had time to equalize since deselection of the last cell sharing the same bit lines. The present invention is used to best advantage when the load control pulse is over before cell deselection. The illustrated embodiments can be combined with means for forcing the bit lines to desired levels for writing to the memory cells. These and other variations upon and modification to the described embodiment are provided for by the present invention, the scope of which is limited only by the following claims.

What is claimed is:

1. A memory device comprising:
    a memory cell array arranged in rows and columns, each of said rows including plural memory cells, each of said columns including plural memory cells, each of said memory cells having a true output and a complementary output;
    bit-line means for communicating to said cells, said bit line means including a true-bit line and a complementary-bit line for each of said columns;
    load means for providing load currents to said true-bit lines and said complementary-bit lines, said load means including a load for each of said true-bit lines and each of said complementary-bit lines, each load including a load-varying transistor having a load control input for modulating the current provided by the load to the respective column, each load including a bypass transistor having a bypass control input tied to a constant voltage for limiting the extent to which the current through said load can be modulated, said bypass transistor being in parallel with said load-varying transistor;
    a sense amplifier having a true-bit input and a complementary-bit input, said sense amplifier providing an output indicating which of the true-bit input and the complementary-bit input is at a higher voltage;
    multiplexer means for selectively coupling said true-bit lines to said true-bit input and for selectively coupling said complementary-bit lines to said complementary-bit input, said multiplexer including select input means for receiving a column address code determining a column to have its true bit line coupled to said true-bit input and to have its complementary-bit line coupled to said complementary-bit input;
    row address means for receiving a row address code;
    row decoder means for selecting one of said rows for activation so that each cell in the selected row is coupled at its true output to the true-bit line belonging to the column containing that cell and at its complementary-bit output to the complementary-bit line belonging to the same column, said row decoder means being coupled to said row address means for receiving row address codes therefrom;
    column decoder means for receiving column address codes, said column decoder means being coupled to said multiplexer for selecting which column is to have its true bit line and its complementary-bit line coupled to said sense amplifier; and
    an address transition detector for providing a load-control pulse to the first load control input of the loads for the true-bit line and the complementary-bit line of a selected column in response to a transition in said row address code, said load-control pulse causing the load-varying transistors of the true-bit line and the complementary-bit line of the selected column to be turned off during said load pulse, said address transition detector being coupled to said row address means and said column address means, said address transistion detector being coupled to the control inputs of said load-varying transistors;
    whereby, said load means provides a relatively large load current except as it is pulsed immediately after an address transition,
    said load means, while providing a relatively large load current, promoting rapid pre-charging prior to a next address transition, and
    said load means, while providing a relatively small load current during said load control pulse, permitting more rapid voltage differential development between said bit lines, in the case of a read operation, and within a selected memory cell, in the case of a write operation.

* * * * *